United States Patent
Chiang

(10) Patent No.: US 12,382,673 B2
(45) Date of Patent: Aug. 5, 2025

(54) METHOD OF MAKING A FIN FIELD-EFFECT TRANSISTOR AVOIDING SKEWING AND BENDING OF THE FINS

(71) Applicant: HON HAI PRECISION INDUSTRY CO., LTD., New Taipei (TW)

(72) Inventor: Kuang-Hao Chiang, New Taipei (TW)

(73) Assignee: HON HAI PRECISION INDUSTRY CO., LTD., New Taipei (TW)

(*) Notice: Subject to any disclaimer, the term of this patent is extended or adjusted under 35 U.S.C. 154(b) by 455 days.

(21) Appl. No.: 17/585,840

(22) Filed: Jan. 27, 2022

(65) Prior Publication Data

US 2022/0254926 A1    Aug. 11, 2022

(30) Foreign Application Priority Data

Feb. 9, 2021   (CN) .......................... 202110183359.7

(51) Int. Cl.
*H10D 30/62*    (2025.01)
*H10D 30/01*    (2025.01)
*H10D 30/69*    (2025.01)

(52) U.S. Cl.
CPC ......... *H10D 30/797* (2025.01); *H10D 30/024* (2025.01); *H10D 30/62* (2025.01)

(58) Field of Classification Search
None
See application file for complete search history.

(56) References Cited

U.S. PATENT DOCUMENTS

| | | | |
|---|---|---|---|
| 2010/0323494 A1* | 12/2010 | Liao | H01L 21/76237 438/424 |
| 2014/0042491 A1 | 2/2014 | Chen et al. | |
| 2014/0117462 A1* | 5/2014 | Cheng | H10D 30/0241 257/E21.546 |
| 2014/0346576 A1* | 11/2014 | Lu | H10D 30/0275 438/297 |
| 2015/0097243 A1* | 4/2015 | Ontalus | H10D 86/201 257/350 |
| 2016/0181161 A1* | 6/2016 | Song | H10D 84/0128 438/400 |
| 2016/0351681 A1* | 12/2016 | Akarvardar | H10D 30/751 |
| 2018/0151703 A1 | 5/2018 | Lin et al. | |
| 2020/0212195 A1* | 7/2020 | Wang | H01L 21/0262 |

FOREIGN PATENT DOCUMENTS

TW    201830498 A    8/2018

* cited by examiner

*Primary Examiner* — Bilkis Jahan
(74) *Attorney, Agent, or Firm* — ScienBiziP, P.C.

(57) ABSTRACT

A method of making a Fin Field-effect transistor includes: providing a substrate and a plurality of fin structures on a surface of the substrate; forming a shallow trench isolation structure between the plurality of fin structures; forming a stress layer on a side of the shallow trench isolation structure away from the substrate; heat treating the stress layer and the plurality of fin structures; and removing the stress layer. The fin structures are spaced apart from each other. The stress layer covers a part of the fin structures away from the substrate.

10 Claims, 3 Drawing Sheets

METHOD OF MAKING A FIN FIELD-EFFECT TRANSISTOR AVOIDING SKEWING AND BENDING OF THE FINS

FIELD

The subject matter herein generally relates to a field of semiconductor manufacturing, particularly relates to a method of making a Fin Field-effect transistor.

BACKGROUND

In order to overcome the short channel effect of planar transistors and avoid leakage of current, a three-dimensional multi gate structure such as fin field-effect transistor (Fin-FET) has been developed. The FinFET includes a fin part and a dielectric layer on a surface of the semiconductor substrate, a gate, a source region, and a drain region. The dielectric layer covers a part of the side wall of the fin part, and a surface of the dielectric layer is lower than a top of the fin part. The gate is on the surface of the dielectric layer and the top and side wall surfaces of the fin part. The source region and the drain region are located in the fin part on both sides of the gate. The FinFET greatly improves circuit control and reduces leakage current. The fin part of FinFET is usually long and narrow, with a large depth-to-width ratio. However, the increased depth-to-width ratio of the fin part is subject to being skewed and bent, affecting the performance of the FinFET.

BRIEF DESCRIPTION OF THE DRAWINGS

Implementations of the present technology will now be described, by way of embodiments only, with reference to the attached figures.

DETAILED DESCRIPTION

Figure 1:
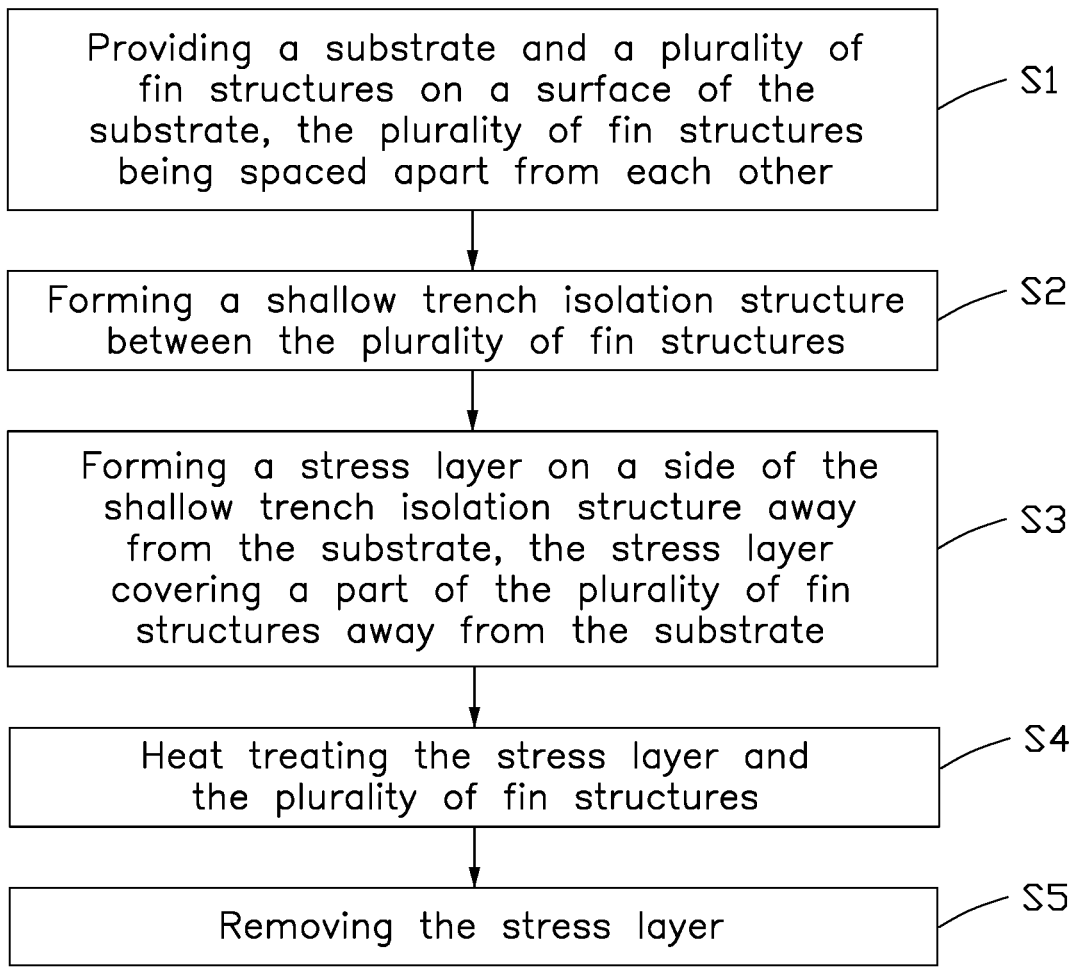
FIG. 1 is a flowchart of a method for making a fin field-effect transistor according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as coupled, whether directly or indirectly through intervening components, and is not necessarily limited to physical connections. The connection can be such that the objects are permanently coupled or releasably coupled. The term "comprising" when utilized, means "including, but not necessarily limited to"; it specifically indicates open-ended inclusion or membership in the so-described combination, group, series, and the like.

The present disclosure describes an exemplary method for making a FinFET. In a particular embodiment of the disclosure, the FinFET may be formed on a bulk silicon substrate. In addition, the FinFET can be formed on a silicon on insulator (SOI) substrate or a germanium on insulator (GOI) substrate. In some embodiments, the silicon substrate may include other conductive layers or other semiconductor elements, such as transistors, diodes, etc.

Referring to FIG. 1, a method of making a FinFET provided by the embodiment of the present disclosure includes steps S1 to step S5.

Step S1: providing a substrate and a plurality of fin structures on a surface of the substrate. The fin structures are spaced apart from each other.

Step S2: forming a shallow trench isolation structure between the fin structures.

Step S3: forming a stress layer is on a side of the shallow trench isolation structure away from the substrate. The stress layer covers a part of the fin structures away from the substrate.

Step S4: heat treating the stress layer and the fin structures.

Step S5: removing the stress layer.

Figure 2:
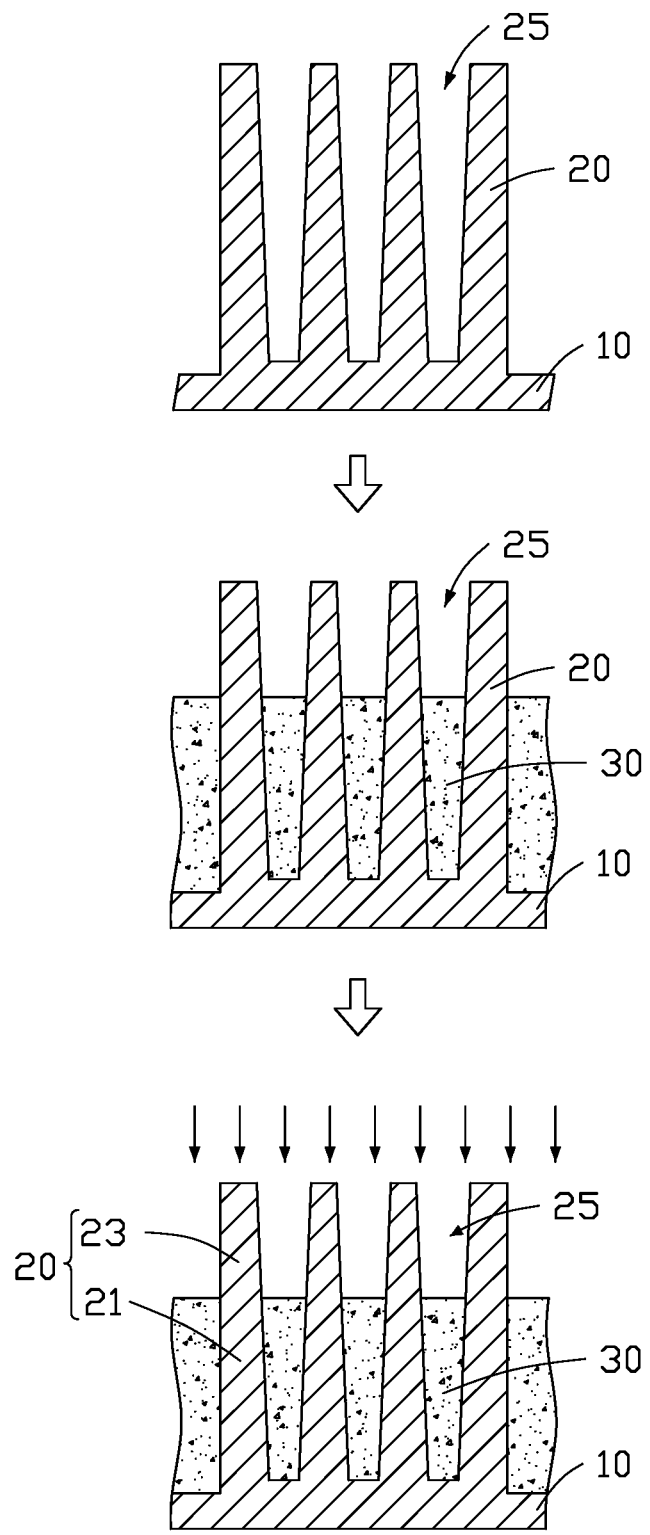
FIG. 2 is a cross-sectional view showing steps S1 to S2 of the flowchart in FIG. 1.
Figure 3:
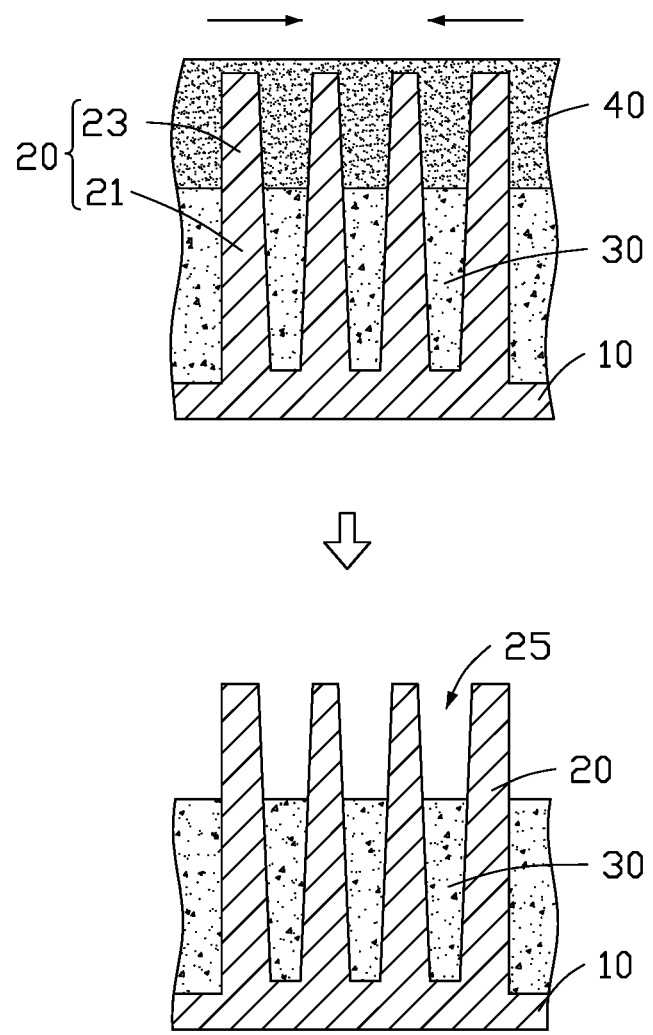
FIG. 3 is a cross-sectional view showing steps S3 to S7 of the flow chart in FIG. 1.

FIG. 2 to FIG. 3 are cross-sectional views for making a FinFET according to an embodiment of the present disclosure.

As shown in FIG. 2, the fin structures 20 and the substrate 10 are integrated. The Step S1 may specifically include providing a semiconductor substrate (not shown), and forming a patterned mask layer (not shown) defining a position of the fin structures on a surface of the semiconductor substrate, and etching the semiconductor substrate by an etching process to form the substrate 10 and the plurality of fin structures 20. The substrate may be a silicon substrate 10, a substrate 10 doped with germanium, or an insulating layer coated with silicon, which can include various doped regions, deep buried layers, etc.

In other embodiments, the fin structures 20 can be formed by depositing a fin material layer on the substrate 10 and then etching the fin material layer.

The fin structures 20 can also be doped with different ions according to the type of FinFET to be formed, to adjust a threshold voltage of FinFET. When an N-type FinFET is to be formed, the fin structures 20 are doped with P-type ions. When a P-type FinFET is to be formed, the fin structures 20 are doped with N-type ions.

Each fin structure 20 protrudes from the same surface of the substrate 10. Each fin structure 20 is narrow and long, and has a certain depth-to-width ratio, and a height of the fin structure 20 is greater than a width of the substrate 10. The width of each fin structure 20 is in a range from 8 nm to 20 nm. A distance between adjacent fin structures 20 is in a range from 20 nm to 50 nm.

A groove 25 is formed between adjacent fin structures 20. The space of the groove 25 is the part where the substrate is removed by etching when the substrate is etched. In this embodiment, the width of the fin structure 20 gradually decreases upwards away from the substrate 10, and the width of the groove 25 gradually increases upwards away from the substrate 10.

As shown in FIG. 2, step S2 is to form a shallow trench isolation structure 30 by infilling insulating material in the grooves 25 between adjacent fin structures 20. A height of the shallow trench isolation structure 30 is lower than the height of the fin structure 20. That is, a surface of the shallow trench isolation structure 30 away from the substrate 10 is lower than an end face of the fin structure 20 away from the substrate 10, to expose a portion of the fin structures 20. That is, the shallow trench isolation structure 30 divides each fin structure 20 into two parts: a first part 21 and a second part 23 connected to the first part 21. The first part 21 is connected between the substrate 10 and the second part 23. The first part 21 is in contact with the shallow trench isolation structure 30. The second part 23 is exposed from the shallow trench isolation structure 30. The shallow trench isolation structure 30 can be formed by chemical vapor deposition process, physical vapor deposition process, or thermal oxidation growth process. Generally, a thicker insulating material can be deposited to completely infill the grooves 25 between adjacent fin structures 20, and then the insulating material can be etched back until a part of each fin structure 20 is exposed.

The shallow trench isolation structure 30 is used to electrically isolate the adjacent fin structures 20. The shallow trench isolation structure 30 is made of insulating materials such as silicon oxide, silicon oxynitride, or silicon hydroxide. In this embodiment, the shallow trench isolation structure 30 is made of silicon oxide. The method of forming the shallow trench isolation structure 30 is a deposition process, such as atomic layer deposition process, low-pressure chemical vapor deposition process, or plasma enhanced chemical vapor deposition process. In this embodiment, the isolation structure material layer is formed by a plasma enhanced chemical vapor deposition process.

In the process of step S2, the fin structures 20 are prone to skewing and bending. Therefore, steps S3-S5 are performed for reinforcement to reduce the skewing and bending of the fin structures 20.

In step S3, the stress layer 40 may be made of silicon nitride, silicon oxide, hafnium oxide, silicon, or silicon germanium material. As shown in FIG. 3, the stress layer 40 is arranged on the shallow trench isolation structure 30 to completely cover the second part 23 of each fin structure 20. The stress layer 40 may be made by conventional film deposition processes, such as atomic layer deposition process, low-pressure chemical vapor deposition process, or plasma enhanced chemical vapor deposition process. The stress layer 40 has effect of pulling each fin structure 20 from one side or the other to a middle of the fin structure 20 on the second part 23 of each fin structure 20, so as to avoid skewing and bending of the fin structures 20.

In step S4, the stress layer 40 is heat treated. The heat treatment is carried out at a temperature in a range from 400° C. to 800° C. for 10-30 minutes. The heat treatment in this step further enhances the pulling effect of the stress layer 40, so as to strengthen the uprightness of the fin structures 20. This step is not limited to heat treatment, but can also be ultraviolet irradiation, etc.

In step S5, the method of removing the stress layer 40 is not limited, for example, conventional etching or machining can be used.

In this way, the fin structures 20 are supported and remain upright without sagging or bending, by the heat treatment of the stress layer 40.

The making method may also include a step of bombarding the fin structure 20 and the shallow trench isolation structure 30 with ions after the step S2 and before the step S3. The fin structure 20 and the shallow trench isolation structure 30 are softened to a certain extent by the bombardment, so as to allow a better pulling effect with less physical resistance after the stress layer 40 is formed.

After step S5 is completed, the making method also includes forming other component layers, such as forming a gate, a source, and a drain. For example, if the fin structure 20 extends in a first direction parallel to the substrate 10, a gate (not shown) across the fin structure 20 needs to be formed. The gate extends in a second direction parallel to the substrate 10 and perpendicular to the first direction, and the gate covers the top and side walls of the fin structure 20.

In the making method of the FinFET, a stress layer 40 completely covering the upper part of the fin structures 20 is arranged, resulting in the centering effect of applying a pulling force towards the center from opposite sides of each fin structure 20, so as to ensure the uprightness of each fin structure 20 and avoid skewing and bending of fin structure 20. In addition, after the stress layer 40 is removed, the subsequent formation of other components on the fin structure 20 is not affected, and the fin structure 20 will remain upright in the subsequent steps of forming other components on the fin structure 20.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A method of making a Fin Field-effect transistor, comprising:
   providing a substrate and a plurality of fin structures on a surface of the substrate, the plurality of fin structures being spaced apart from each other;
   forming a shallow trench isolation structure on the substrate and between the plurality of fin structures, wherein each of the plurality of fin structures comprises a first part and a second part connected to the first part; the first part is connected between the substrate and the second part; the shallow trench isolation structure is in contact with and surrounding the first part of each of the plurality of fin structures; the second part of each of the plurality of fin structures is exposed from the shallow trench isolation structure;
   forming a stress layer on a side of the shallow trench isolation structure away from the substrate, the stress layer being in direct contact with and completely covering a sidewall and a top surface of the second part of each of the plurality of fin structures;
   heat treating the stress layer and the plurality of fin structures, the stress layer configured to keep the plurality of fin structures from skewing and bending during the heat treating; and
   removing the stress layer.

2. The method of claim 1, wherein providing the substrate and the plurality of fin structures comprises: providing a semiconductor substrate and etching the semiconductor substrate to form the substrate and the plurality of fin structures.

3. The method of claim 1, wherein the shallow trench isolation structure is made of an insulating material.

4. The method of claim 1, wherein forming the shallow trench isolation structure further comprises forming a surface of the shallow trench isolation structure away from the substrate lower than an end face of the fin structure away from the substrate, thereby exposing the second part of the plurality of fin structures, the top surface of the second part of each of the plurality of fin structures faces away from the substrate.

5. The method of claim 4, wherein each of the plurality of fin structures having a height and a maximum width, and the height is greater than the maximum width.

6. The method of claim 5, wherein the stress layer is formed to completely covers the second part of each of the plurality of fin structures; the stress layer is between the plurality of fin structures.

7. The method of claim 1, wherein the stress layer is made of silicon nitride, silicon oxide, hafnium oxide, silicon, or silicon germanium material.

8. The method of claim 1, wherein heat treating the stress layer and the plurality of fin structures is carried out at a temperature in a range from 400° C. to 800° C. for 10 to 30 minutes.

9. The method of claim 1, further comprising ion bombarding the fin structure and the shallow trench isolation structure before forming the stress layer.

10. A method of making a Fin Field-effect transistor, comprising:

providing a substrate and a plurality of fin structures on a surface of the substrate, the plurality of fin structures being spaced apart from each other;

forming a shallow trench isolation structure between the plurality of fin structures, wherein each of the plurality of fin structures comprises a first part and a second part connected to the first part; the first part is connected between the substrate and the second part; the shallow trench isolation structure is in contact with and surrounding the first part of each of the plurality of fin structures; the second part of each of the plurality of fin structures is exposed from the shallow trench isolation structure;

forming a stress layer on a side of the shallow trench isolation structure away from the substrate, the stress layer being in direct contact with and completely covering a sidewall and a top surface of the second part of each of the plurality of fin structures;

ultraviolet irradiating the stress layer and the plurality of fin structures, the stress layer configured to keep the plurality of fin structures from skewing and bending during the ultraviolet irradiating; and removing the stress layer.

* * * * *